United States Patent [19]

Carlson et al.

[11] 4,163,677

[45] Aug. 7, 1979

[54] SCHOTTKY BARRIER AMORPHOUS SILICON SOLAR CELL WITH THIN DOPED REGION ADJACENT METAL SCHOTTKY BARRIER

[75] Inventors: David E. Carlson, Yardley, Pa.; Christopher R. Wronski, Princeton, N.J.

[73] Assignee: RCA Corporation, New York, N.Y.

[21] Appl. No.: 901,256

[22] Filed: Apr. 28, 1978

[51] Int. Cl.$^2$ ............................................ H01L 31/06
[52] U.S. Cl. ........................... 136/89 TF; 136/89 SJ; 136/89 CC; 357/2; 357/15; 357/30
[58] Field of Search ................... 136/89 TF, 89 SJ; 357/2, 15, 30

[56] References Cited

U.S. PATENT DOCUMENTS

| 4,064,521 | 12/1977 | Carlson | 357/2 |
| 4,117,506 | 9/1978 | Carlson et al. | 357/30 |
| 4,126,150 | 11/1978 | Bell et al. | 136/89 TF |

OTHER PUBLICATIONS

J. M. Shannon, "Control of Schottky Barrier Height Using Highly Doped Surface Layers," Solid–State Electronics, vol. 19, pp. 537–543, (1976).

Primary Examiner—Aaron Weisstuch
Attorney, Agent, or Firm—Birgit E. Morris; A. Stephen Zavell

[57] ABSTRACT

A Schottky barrier amorphous silicon solar cell incorporating a thin highly doped p-type region of hydrogenated amorphous silicon disposed between a Schottky barrier high work function metal and the intrinsic region of hydrogenated amorphous silicon wherein said high work function metal and said thin highly doped p-type region forms a surface barrier junction with the intrinsic amorphous silicon layer. The thickness and concentration of p-type dopants in said p-type region are selected so that said p-type region is fully ionized by the Schottky barrier high work function metal. The thin highly doped p-type region has been found to increase the open circuit voltage and current of the photovoltaic device.

12 Claims, 1 Drawing Figure

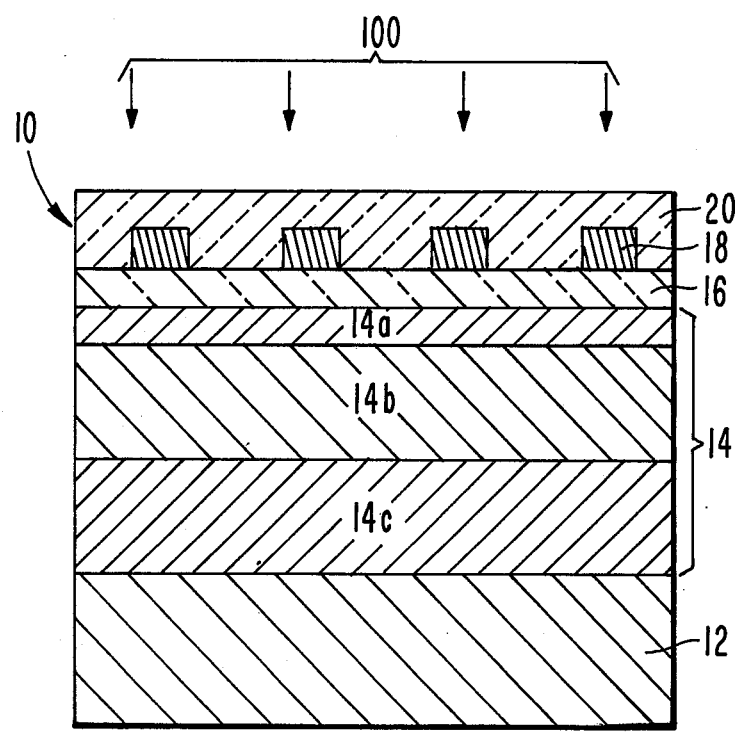

SCHOTTKY BARRIER AMORPHOUS SILICON SOLAR CELL WITH THIN DOPED REGION ADJACENT METAL SCHOTTKY BARRIER

The present invention relates to amorphous silicon solar cells. More particularly, the invention relates to Schottky barrier hydrogenated amorphous silicon solar cells.

The invention described herein was made during the performance of work under Energy Research and Development Administration Contract EY-76-C-03-1286.

BACKGROUND OF THE INVENTION

Photovoltaic devices such as solar cells are capable of converting solar radiation into useable electrical energy. The energy conversion occurs as the result of what is well known in the solar cell field as the "photovoltaic effect". Two basic steps are involved in the photovoltaic effect. Initially, solar radiation absorbed by the semiconductor generates electrons and holes. Secondly, the electrons and holes are separated by a built-in electric field in the semiconductor solar cell. This separation of electrons and holes results in the generation of an electrical current. A built-in electric field can be generated in a solar cell by, for example, a Schottky barrier. The electrons generated at the metal (Schottky barrier) semiconductor body junction flow toward the semiconductor body where said electrons can be collected.

PIN amorphous silicon solar cells generated higher open circuit voltages than Schottky barrier amorphous silicon solar cells; however, the short-circuit currents generated in PIN cells are lower than in Schottky barrier cells because of losses from the recombination of holes and electrons. The lower voltages of the Schottky barrier hydrogenated amorphous silicon solar cells are due mainly to the barrier height of the high work function metals being limited by surface states.

Thus, it would be highly desirable to increase the open circuit voltage of a Schottky barrier hydrogenated amorphous silicon solar cell and to also maintain a large value for the short-circuit current density.

SUMMARY OF THE INVENTION

A thin, highly doped p-type region of hydrogenated amorphous silicon disposed between a Schottky barrier high work function metal and a body of intrinsic hydrogenated amorphous silicon increases the barrier junction height, thereby increasing the open circuit voltage and short-circuit current of the Schottky barrier hydrogenated amorphous silicon solar cell. The increase in barrier height causes the open-circuit voltage to increase because of a reduction in the reverse saturation current. The short-circuit current can exhibit a small increase due to an increase in the built-in potential. The doping concentration and the thickness of the p-type region should be selected such that the high work function metal is able to fully ionize said highly doped p-type region.

BRIEF DESCRIPTION OF THE DRAWING

The FIGURE illustrates a Schottky barrier hydrogenated amorphous silicon solar cell with a thin highly doped p-type region adjacent to the Schottky barrier high work function metal.

DETAILED DESCRIPTION OF THE INVENTION

Schottky barrier hydrogenated amorphous silicon solar cells incorporate a thin semitransparent high work function metal to form a Schottky barrier to the body of hydrogenated amorphous silicon. The characteristics of the junction formed by the Schottky barrier metal to the body of hydrogenated amorphous silicon are a critical parameter in determining the performance of the solar cell. Inter alia, the Schottky barrier junction determines the open circuit voltage ($V_{OC}$) of the silicon solar cell. The open circuit voltage depends upon the short circuit current, the diode quality factor, and the saturation current density. Our modified Schottky barrier cell utilizes an increase in the diode quality factor and an enhancement of the Schottky barrier height to increase the $V_{OC}$ over a conventional Schottky barrier hydrogenated amorphous silicon solar cell.

Referring to the FIGURE, a Schottky barrier hydrogenated amorphous silicon solar cell of the present invention is designated as 10, hereinafter solar cell 10. Solar radiation 100 impinging on solar cell 10 is a reference point for the incident surface of each layer or region of the solar cell. Solar cell 10 includes a substrate 12 of a material having good electrical conductivity properties and the ability to make an ohmic contact to a hydrogenated amorphous silicon body 14. Examples of suitable substrate materials are aluminum, chromium, stainless steel, niobium, tantalum, iron, molybdenum, titanium, indium tin oxide on glass wherein tin oxide is the conductive material, and the like.

The hydrogenated amorphous silicon body 14 is fabricated by a glow discharge as taught in U.S. Pat. No. 4,064,521, incorporated herein by reference, or "An Article And Device Having An Amorphous Silicon Containing A Halogen And Method Of Fabrication", Ser. No. 727,659, filed Sep. 29, 1976, incorporated herein by reference or "A Schottky Barrier Semiconductor Device And Method Of Making Same", Ser. No. 710,186, filed July 30, 1976, incorporated herein by reference. The method of deposition known as glow discharge involves the discharge of electricity through a gas at a relatively low pressure, i.e., about 5 Torr or less.

An amorphous material is one which has no long range order in periodicity of the matrix. Amorphous silicon fabricated by a glow discharge in silane possess a short range order of no more than 20 angstroms. The lack of long range order of amorphous silicon material fabricated by a glow discharge in silane can be detected by X-ray or electron diffraction.

The body 14 may be entirely composed of intrinsic amorphous silicon 14b fabricated by a glow discharge in substantially pure silane. However, an n+-type region 14c of the body 14, in intimate contact with the substrate 12, provides a better ohmic contact to the substrate 12 then does intrinsic amorphous silicon 14b. The n+-type region 14c is deposited in silane and a doping gas to a thickness of from about 100 to about 500 angstroms. Typically, n+-type dopant gases can be selected from the group consisting of phosphine and arsine and materials such as antimony, bismuth, cesium nitride and sodium hydride, and the like. After the n+-type region 14c is deposited, the doping gas is pumped out of the system and deposition is continued in silane alone to deposit a region 14b of intrinsic hydrogenated amorphous silicon. The intrinsic region is from about 2000 to about 10,000 angstroms thick. Thereafter, a thin highly doped p-type region 14a is deposited on the intrinsic amorphous region 14b prior to the deposition of a Schottky barrier high work function metal layer 16.

The p-type region 14a differentiates this cell over prior art Schottky barrier hydrogenated amorphous silicon solar cells. This thin highly doped p-type region 14a raises the Schottky barrier height and improves the performance of the solar cell 10. The thin highly doped p-type region 14a is from about 50 to about 100 angstroms thick. Suitable p-type dopants may be selected from the group consisting of boron, aluminum, and the like, at a concentration from about 0.001 to about 1.00 percent of the p-type dopant in the silane-p-type dopant atmosphere. Preferably, the p-type dopant concentration is about 0.10% of the silane-p-type dopant concentration. Said p-type dopant concentration will result in a p-type region with a doping concentration of about $5 \times 10^{18}$ to about $5 \times 10^{20}$ p-type dopant atoms per cm$^3$. The thin highly doped p-type region of hydrogenated amorphous silicon adjacent to the Schottky barrier metal results in a diode quality factor in the dark and under illumination which are greater than unity. The increase can be achieved without a decrease in the short circuit current.

In making the present cells, the doping concentration and the thickness of the p-type region is adjusted so that the Schottky barrier metal deposited thereon fully ionizes said highly doped thin p-type region. If the region is too thick, then it would not be completely ionized by the Schottky barrier metal 16 and the solar cell 10 will act like a normal PIN cell with a lower current due to recombination in the thick p-type region. If the region is too thin, then it will not be sufficient to raise the barrier height of the junction.

The high work function metal layer 16 is at least semitransparent to solar radiation and is of a metallic material with good electrical conductivity and a high work function, i.e., 4.5 eV or greater, such as gold, platinum, palladium, chromium, iridium, rhodium, and the like. The metallic region 16 may be a single layer of a metal or it may be multi-layered. If the metallic layer 16 is multi-layered, a first layer could be of platinum on the body 14 to assure a large Schottky barrier height and a second layer on the first platinum layer could be of gold or silver for good electrical conductivity. The metallic layer 16 should be only about 50 angstroms thick in order to be semitransparent to solar radiation.

Ohmically contacting the high work function metal Schottky barrier layer 16 is a metal grid electrode 18 of a metal of good electrical conductivity. The grid electrode 18 occupies only a small area of the surface of the metallic layer 16, i.e., about 5 to 10%, since solar radiation impinging on grid electrode 18 may be reflected away from the body 14. The function of the grid electrode 18 is to uniformly collect current from metallic layer 16. The grid electrode 18 also assures a low series resistance from solar cell 10.

As the size of the solar cell decreases, the need for the grid structure 18 diminishes. With a small solar cell, a transparent conductive oxide layer 20 with a sheet resistivity less than 10 ohms/□ is sufficient to withdraw the current generated during the operation of solar cell 10. A transparent conductive oxide layer 20 functioning as an antireflection coating and a supplemental electrode to grid structure 18, is deposited on grid electrode 18 and the Schottky barrier metal layer 16. The transparent conductive oxide can be selected from tin oxide, indium tin oxide, cadmium stannate, and the like.

The invention will be more clearly illustrated by the following examples.

EXAMPLE 1

A molybdenum substrate about 1 millimeter thick was sputter cleaned in a direct current (DC) discharge at a pressure of about 0.6 Torr in an atmosphere of about 50% argon and about 50% H$_2$ at a temperature of about 300° C. for about 4 minutes.

An n$^+$-type region was deposited on the cleaned substrate in an atmosphere of about 98.0% silane and about 2.0% PH$_3$ at a temperature of about 330° C. This coating was deposited by a DC proximity discharge at a current density of about 0.45 milliamperes (ma)/cm$^2$ at the cathodic screen at a pressure of about 0.65 Torr and a spacing of about 5 mm between the cathodic screen and the substrate. A thickness of about 150 angstroms was obtained in about 15 seconds.

The chamber was pumped out and pure silane bled in and the deposition continued for about 8 minutes to deposit a 5,000 angstroms thick layer of intrinsic hydrogenated amorphous silicon.

Diborane (B$_2$H$_6$) was then added to the silane in an amount such that it was present in the vacuum chamber in a concentration of about 1% of the silane-diborane atmosphere. The deposition was continued for about 10 seconds to deposit a 100 angstroms thick region of highly doped p-type hydrogenated amorphous silicon at a temperature of 300° C.

A platinum film about 50 angstroms thick was evaporated onto the p-type region to form a Schottky barrier. Finally, 400 angstroms of platinum followed by about 10,000 angstroms of aluminum were evaporated onto the 50 angstroms of platinum in a grid pattern to form a grid electrode,

EXAMPLES II-IV

Examples II-IV were made according to Example I, however, the diborane concentration in the silane-diborane atmosphere was 0.1%, 0.01%, and 0.001%, respectively.

CONTROL

A conventional Schottky barrier amorphous silicon solar cell was fabricated by following the procedure of Example I but without depositing a thin highly doped p-type region.

Table I below gives a comparison of the open circuit voltage (V$_{OC}$), open circuit current (J$_{SC}$) and conversion efficiency (N), for the conventional Schottky barrier solar cell (control) and the Schottky barrier hydrogenated amorphous silicon solar cells with a thin highly doped p-type region adjacent to the metal prepared as in Examples I-IV.

TABLE I

| Example | B$_2$H$_6$, % | V$_{OC}$(mV) | J$_{SC}$(mA/cm$^2$) | N(%) |
|---------|---------------|--------------|---------------------|------|
| Control | 0             | 493          | 5.50                | 1.41 |
| I       | 1.00          | 543          | 4.75                | 1.24 |
| II      | 0.10          | 644          | 6.00                | 1.93 |
| III     | 0.01          | 561          | 5.50                | 1.54 |
| IV      | 0.001         | 546          | 5.75                | 1.63 |

The date indicates that the effective doping concentration in relation to silane concentration in the vacuum chamber is from about 0.001% to about 1% as indicated by the open circuit voltage. On either side of a diborane concentration of 0.10% the $V_{OC}$ drops off. In addition, the data further indicates that the optimum doping concentration of about 0.10% gives the highest conversion efficiency (N), a 37% increase over the control, the highest open circuit current, and highest open circuit voltage.

We claim:

1. A Schottky barrier amorphous silicon solar cell:
   a substrate which is electrically conductive;
   a body of hydrogenated amorphous silicon having three regions of hydrogenated amorphous silicon of differing conductivity type wherein a first region of n+-type hydrogenated amorphous silicon electrically contacts said substrate, a second region of intrinsic hydrogenated amorphous silicon contiguous to said first region and a third region of p-type hydrogenated amorphous silicon contiguous to said second region said third region having a thickness of from about 50 to about 100 angstroms and a p-type doping concentration incorporated during the deposition thereof of from about $5 \times 10^{18}$ to about $5 \times 10^{20}$ atoms/cm$^3$, wherein the thickness of said p-type region and concentration of said p-type dopants in said p-type region are selected such that said p-type region is fully ionized by a Schottky barrier high work function metal;
   a high work function metal layer contiguous to said p-type region forming a Schottky barrier therewith on which solar radiation is incident; and
   means for electrically contacting said Schottky barrier.

2. The amorphous silicon solar cell according to claim 1 wherein said p-type region is fabricated with a p-type dopant concentration in a dopant-silane atmosphere of from about 0.001% to about 1%.

3. The amorphous silicon solar cell according to claim 2 wherein said p-type dopant concentration in said dopant-silane atmosphere is about 0.10%.

4. The amorphous silicon solar cell according to claim 3 wherein said p-type dopant is diborane.

5. The amorphous silicon solar cell according to claim 4 wherein said p-type region is about 100 angstroms thick.

6. A Schottky barrier amorphous silicon solar cell according to claim 1 wherein said body of hydrogenated amorphous silicon is fabricated by the glow discharge of a silicon-containing compound.

7. A Schottky barrier amorphous silicon solar cell according to claim 6 wherein said silicon-containing compound is silane.

8. A Schottky barrier amorphous silicon solar cell according to claim 1 wherein said body of amorphous silicon is fabricated by a glow discharge in a gas atmosphere having silicon, hydrogen and halogen atoms, said halogen selected from the group consisting of chlorine, bromine and iodine incorporated into said body in an amount up to about 7 atomic percent.

9. A Scottky barrier amorphous silicon solar cell in accordance with claim 8 wherein said gas atmosphere contains a compound selected from the group consisting of $SiH_2Cl_2$, $SiH_3Cl$, $SiHCl_3$, $SiH_3Br$, $SiH_2Br_2$, and $SiCl_4$.

10. A method of increasing the open circuit voltage of a Schottky barrier amorphous silicon solar ell comprising:
    depositing a p-type hydrogenated amorphous silicon region, by glow discharge of a silicon-containing compound and a p-type dopant, to a thickness of from about 50 to about 100 angstroms wherein the p-type dopant concentration is from about $5 \times 10^{18}$ to about $5 \times 10^{20}$ atoms/cm$^3$ on a region of intrinsic hydrogenated amorphous silicon, prior to the deposition of a Schottky barrier high work function metal layer, wherein the thickness of said p-type region and concentration of siad p-type dopants in said p-type region are selected such that said p-type region is fully ionized by said Schottky barrier high work function metal.

11. The method according to claim 10 wherein said intrinsic hydrogenated amorphous silicon and said p-type hydrogenated amorphous silicon are fabricated by a glow discharge of a silicon-containing compound.

12. The method according to claim 11 wherein said silicon-containing compound is selected from the group consisting of $SiH_4$, $SiH_2Cl_2$, $SiH_3Cl$, $SiHCl_3$, $SiH_3Br$, $SiH_2Br\ 2$, and $SiCl_4$.

* * * * *